United States Patent
Klein

(10) Patent No.: US 6,662,255 B1
(45) Date of Patent: Dec. 9, 2003

(54) SYSTEM FOR HOUSING COMPACTPCI ADAPTERS IN A NON-COMPACTPCI FRAME

(75) Inventor: Philippe Klein, La Gaude (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/561,156

(22) Filed: Apr. 28, 2000

(30) Foreign Application Priority Data

Apr. 29, 1999 (EP) ............................................. 99480026

(51) Int. Cl.⁷ ............................. G06F 13/00; H05K 7/14
(52) U.S. Cl. ........................ 710/301; 361/796; 361/752
(58) Field of Search ............................. 710/300, 301, 710/302, 303, 304; 439/638, 61; 361/788, 796–797, 752, 730, 736; 211/41.17; 174/50

(56) References Cited

U.S. PATENT DOCUMENTS

| | | | | |
|---|---|---|---|---|
| 6,112,271 A | * | 8/2000 | Lanus et al. ................. | 710/301 |
| 6,185,110 B1 | * | 2/2001 | Liu .............................. | 361/683 |
| 6,195,262 B1 | * | 2/2001 | Bodette et al. ............. | 361/752 |
| 6,198,633 B1 | * | 3/2001 | Lehman et al. ............. | 361/756 |
| 6,209,051 B1 | * | 3/2001 | Hill et al. ................... | 327/14 |

* cited by examiner

Primary Examiner—Glenn A. Auve
Assistant Examiner—Trisha Vu
(74) Attorney, Agent, or Firm—Winstead Sechrest & Minick

(57) ABSTRACT

A system for housing CompactPCI cards in a frame that does not meet a specified CompactPCI form factor (3U and 6U) is presented. Existing telecommunication frames have generally a larger depth that those required by the CompactPCI standard (160 mm) and therefore the insertion of CompactPCI cards (201) cannot be performed directly into the main backplane (204) of the frames. An intermediate backplane (200), or so-called CompactPCI backplane, comprising six CompactPCI connectors on a front side for allowing the insertion of up to six CompactPCI adapters (201) (3U and/or 6U), and one doubled-headed CompactPCI connector (203) on a back side being common to one of the six front side connectors (203/206) for insertion of a System Card (202), is connected to the main frame backplane (204) using the System Card (202). The System Card functions as a card extender between the CompactPCI adapters (201) and the main backplane of the frame. The depth of the System Card (209) will be such that the depth of CompactPCI cards (208) plus the depth of the System Card (209) spans the full depth of the frame (207).

6 Claims, 5 Drawing Sheets

Top View

CompactPCI backplane

CompactPCI connector

CompactPCI connector double headed connector
(pins on both side)

SYSTEM FOR HOUSING COMPACTPCI ADAPTERS IN A NON-COMPACTPCI FRAME

TECHNICAL FIELD OF THE INVENTION

The present invention relates to telecommunication systems using network interface cards, and more particularly to a system for housing CompactPCI adapters in a non-mechanically CompactPCI-compliant frame.

BACKGROUND ART

The PCI (Peripheral Component Interconnect) bus specification was originally designed for personal computers and is not well suited for industrial applications in which high reliability, redundancy or hot plugging features are very often considered as key requirements. The CompactPCI standard, incorporated herewith by reference (PCI Industrial Computers—PICMG 2.0 R2.0, CompactPCI Specification Short Form, Feb. 17th 1997), is an adaptation of the PCI specifications for industrial and/or embedded applications requiring a more robust mechanical form factor than desktop PCI. CompactPCI uses industry standard mechanical components and high performance connector technologies to provide a system optimized for rugged applications. CompactPCI is electrically compatible with the PCI specifications and allows a low-cost PCI chipset aimed to a mechanical form factor suited for rugged environments. The form factor defined for CompactPCI adapters is based upon the Eurocard industry standard. Both 3U (100.00 mm by 160.00 mm) and 6U (233.35 mm by 160.00 mm) board sizes are defined. A CompactPCI system comprises a mechanical frame having eight CompactPCI card locations including one System Slot, responsible for bus arbitration, clock distribution and reset functions for all other CompactPCI adapters on the bus, and up to seven Peripheral Slots that may contain adapters, PCI slaves or PCI bus masters.

The CompactPCI adapter cards are intended to be plugged into a CompactPCI frame. Therefore, the cards cannot be mounted in other frames that are not mechanically compliant with the CompactPCI packaging specifications. As indicated above, the depth of the CompactPCI adapter cards is 160.00 mm. This depth is not compatible with the depth, generally above 300 mm, used in most of today's networking and telecommunication devices. In order to use CompactPCI adapters in these devices, it is thus necessary to provide a mechanism that can adapt to the difference in depth.

SUMMARY OF THE INVENTION

The present invention is directed to a system for using CompactPCI adapters in a non-CompactPCI frame, wherein the depth of the frame is larger than the depth of the CompactPCI adapter, and more particularly to a dual side CompactPCI backplane with provisions for accommodating six CompactPCI connectors on a front side of the backplane and one CompactPCI connector on a back side of the backplane. The backplane is designed such that the six CompactPCI connectors on the front side may receive any standard CompactPCI adapter, while the CompactPCI connector on the back side is intended to receive a specific form factor System Card. The System Card is connected on one side to the back side of the CompactPCI backplane, and on the other side to the main backplane of the frame, such that the CompactPCI adapter's depth plus the System card depth spans the full depth of the frame.

A purpose of the present invention is to enable existing CompactPCI adapters cards to be mounted inside a non-standard CompactPCI frame without any design or packaging change. The adaptation is accomplished by the System Card itself according to the packaging dimension of the frame.

BRIEF DESCRIPTIONS OF THE DRAWINGS

The novel and inventive features believed characteristics of the invention are set forth in the appended claims. The invention itself, however, as well as a preferred mode of use, further purposes thereof, will best be understood by reference to the following detailed description of an illustrative detailed embodiment when read in conjunction with the accompanying drawings, wherein:

DETAILED DESCRIPTION OF A PREFERRED EMBODIMENT OF THE INVENTION

The present invention is directed to the assembling of CompactPCI adapters, of which form factor (3U or 6U) is defined by a standard, in a frame that is not initially intended to receive CompactPCI adapters.

Figure 4:
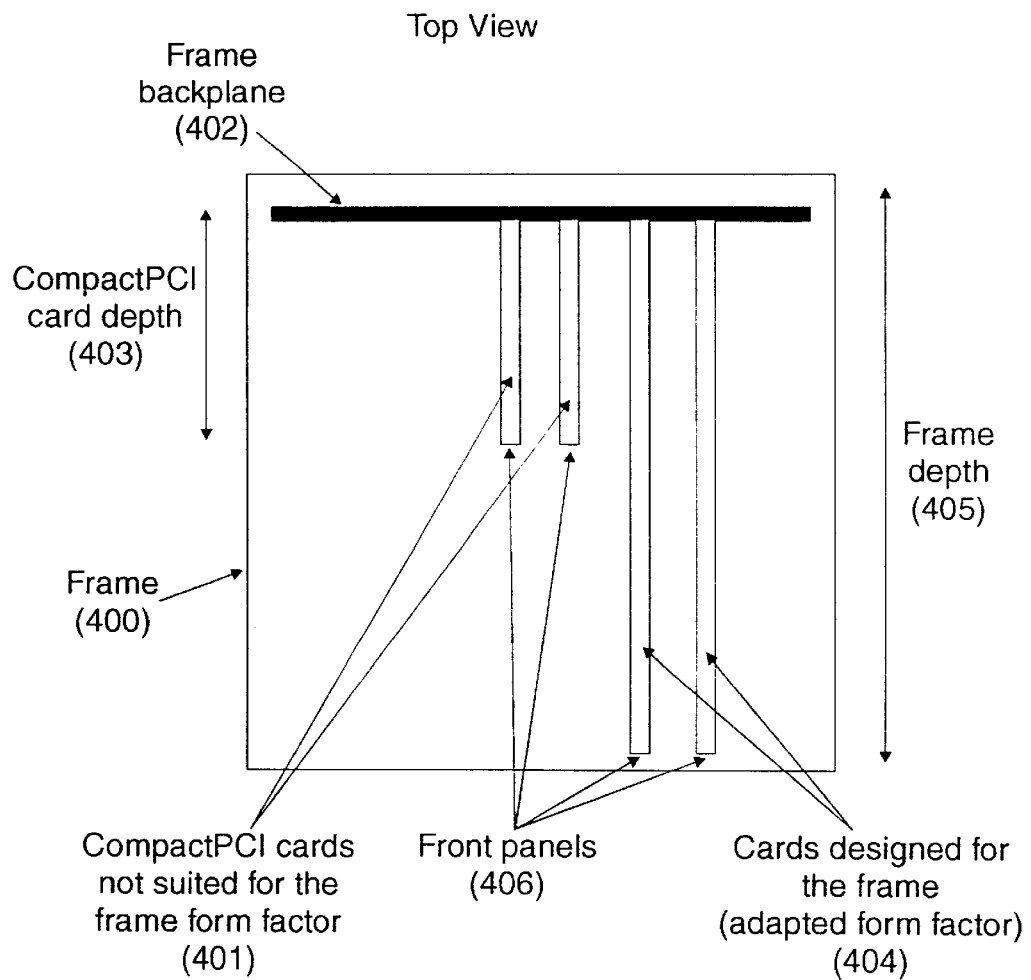
FIG. 4 is a top view of a CompactPCI system according to prior art.

As shown in FIG. 4, a solution for connecting CompactPCI adapters in a frame (400) that is not intended to house CompactPCI adapters (401), would be to redesign backplane (402) of the frame to provide a full CompactPCI connectivity. Apart from the fact that the frame backplane must be redesigned, another packaging problem is raised regarding the depth (403) of the CompactPCI adapters (401) (160.00 mm) compared with the depth of a traditional frame (405). The depth (403) of CompactPCI adapters (401) is generally smaller than the depth of traditional telecommunication and networking products. In this case, CompactPCI adapters (401) are inserted at the bottom of the frame. A resulting problem is that the front panels (406) of the CompactPCI adapters (401) are not aligned with the front panels of other cards (404) specially designed for the frame (400). This raises packaging issues with the frame, and difficulties in connecting network cables to the various front panels (406).

CompactPCI Backplane

Figure 1:
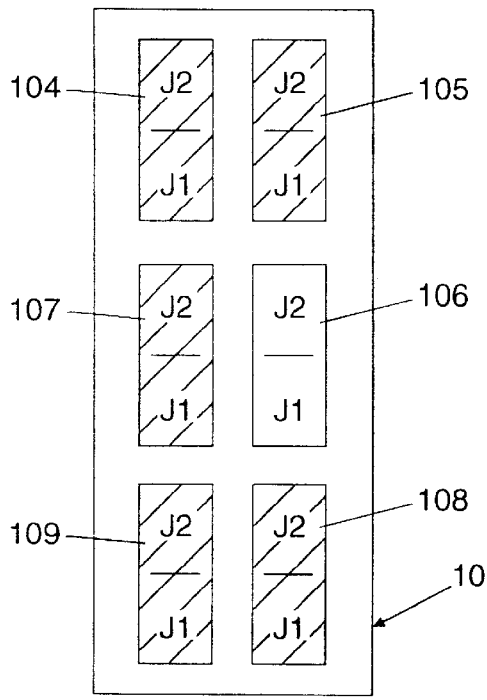
FIG. 1 is a front and back view of a CompactPCI backplane with connectors according to the present invention.
Figure 1:
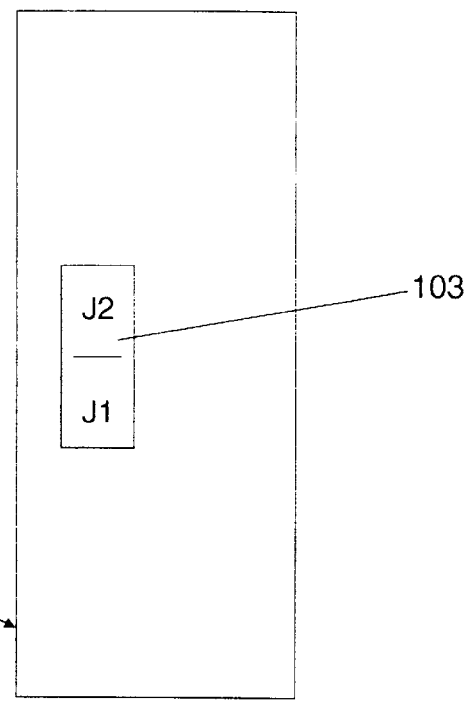
Figure 1:
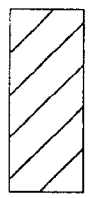
Figure 1:

FIG. 1 shows a front and back view of a CompactPCI backplane according to the present invention. The mounting of the cards is achieved by way of an intermediate CompactPCI backplane (100) mounted with six CompactPCI connectors (104 to 109) (J1 and optionally J2) on the front side (101) and one CompactPCI connector (103) (J1 and optionally J2) on the back side (102). The six CompactPCI connectors (104 to 109) mounted on the front side (101) are adapted to house any standard Peripheral CompactPCI adapter, while the single CompactPCI connector (103) mounted on the back side (102) is intended to house a System Card.

Figure 2:
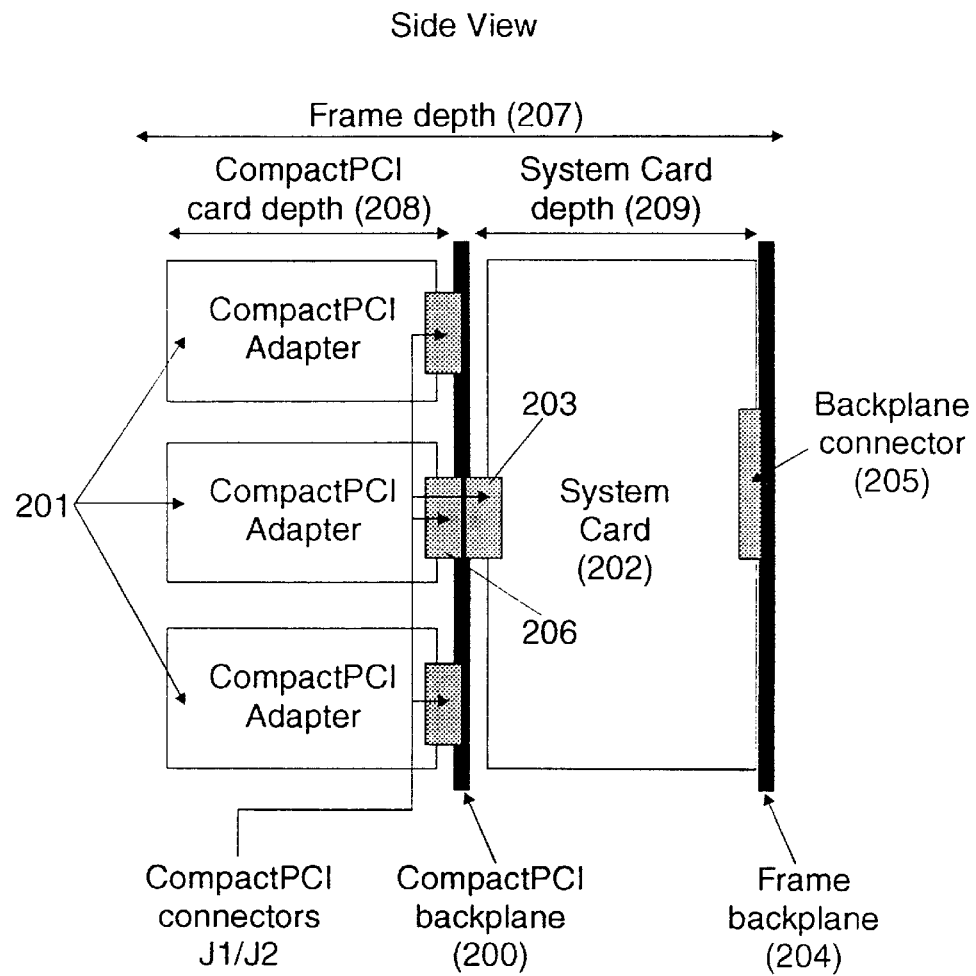
FIG. 2 is a side view of a system including CompactPCI adapters, a CompactPCI backplane and a System Card according to the present invention.
Figure 3:
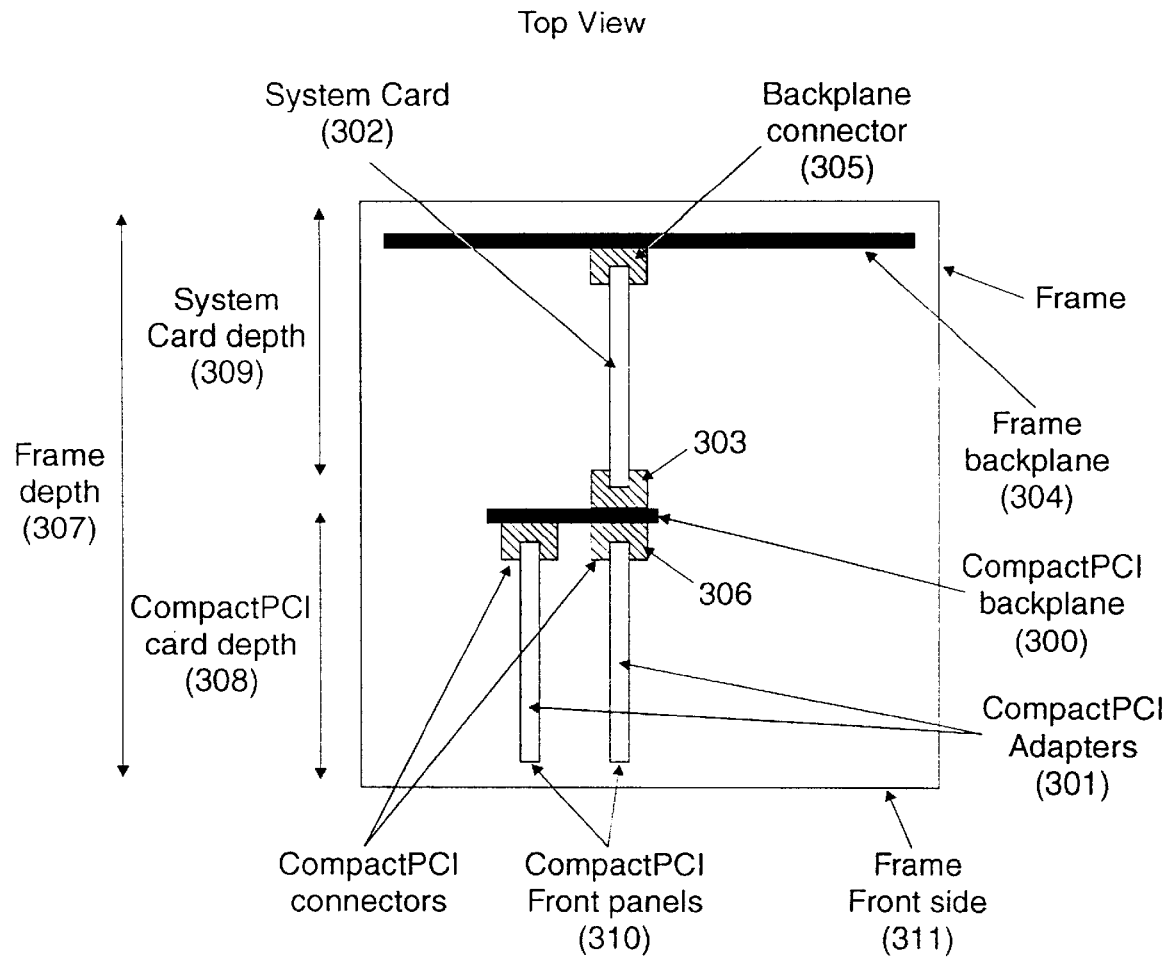
FIG. 3 is a top view of a system including CompactPCI adapters, a CompactPCI backplane and a System Card according to the present invention.

FIG. 2 is a side view of the system according to the present invention comprising six standard CompactPCI 3U adapters (201), one CompactPCI backplane (200) and one System Card (202) inserted into the main backplane (204) of the frame. FIG. 3 is a top view of the same system. The connector (103, 203, 303) located on the back side (102) of the CompactPCI backplane (100, 200, 300) is able to share the same footprint on the printed circuit board of the CompactPCI backplane as one of the six connectors (106, 206, 306) located on the front side of the backplane, (101) by utilizing a standard double-headed CompactPCI connector (203/206, 303/306). This double-headed CompactPCI connector enables the insertion of CompactPCI cards (201/202, 301/302) on both sides (101 & 102) of the CompactPCI backplane (100, 200, 300).

System Card

The System Card (202, 302) is connected to the rear (102) of the CompactPCI backplane (200, 300) using a standard double-headed CompactPCI connector (103, 203, 303), and to the frame backplane (204, 304) using a backplane connector (205, 305). The System Card functions as a card extender to fill the existing empty space within the frame between the CompactPCI adapters (201, 301) and the frame backplane (204, 304). The depth (209, 309) of the System Card is such that the CompactPCI adapter card depth (208, 308) plus the System Card depth (209, 309) spans the frame depth (207, 307). It should be noted that, from a packaging standpoint, the System Card is a standard CompactPCI card, the depth of which depends upon the overall depth of the frame. This configuration results in a system in which all front panels (310) of the CompactPCI adapters (301) are aligned at the frame front side (311).

It should be noted that this same method can be used for installing CompactPCI cards within a non-standard frame, having the previously described 6U form factor or a combination of 3U and 6U form factors.

Double-headed Connector

Figure 5A:
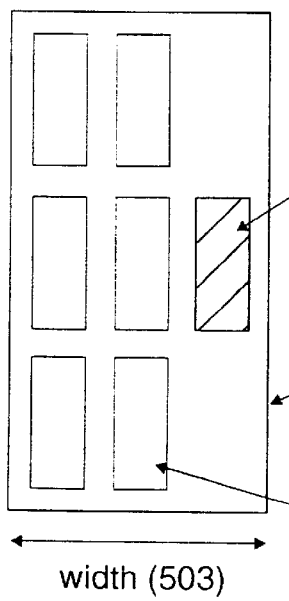
FIG. 5 is a front view of a CompactPCI backplane according to the present invention with and without a double-headed connector.
Figure 5B:
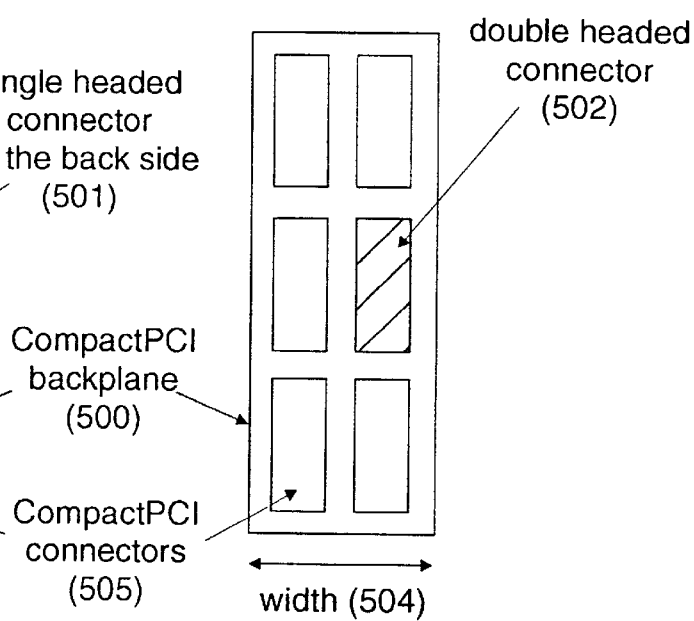

The use of a double-headed CompactPCI connector (103/106, 203/206, 303/306) is not required in the present invention, but when employed, allows for saving space on the CompactPCI backplane (100, 200, 300). As shown in FIG. 5b, when using a double-headed connector (502), the width (504) of the CompactPCI backplane is approximately twice the width of the CompactPCI connector (505). This results from fact that the back side connector does not add additional width onto the CompactPCI backplane (500), as the connector shares the same footprint as a corresponding front side connector. If instead a standard CompactPCI connector (501) (single headed) is used, the width (503) of the CompactPCI backplane will be approximately three times the width of the CompactPCI connector (505), and thus will require more room in the machine for the same connectivity.

While the invention has been particularly shown and described with reference to a preferred embodiment, it will be understood that various changes in form and detail may be made therein without departing from the spirit, and scope of the invention.

Therefore, what I claim is:

1. A system for housing one or more adapter cards of a given depth in a frame comprising a frame backplane, wherein the depth of said frame backplane is larger than the depth of said adapter card, the system comprising:

an intermediate backplane for connecting on a front side of said intermediate backplane said adapter cards; and a system card connected to said frame backplane and to a back side (102) of said intermediate backplane;

wherein the depth of said system card plus the depth of said adapter cards spans the depth of the frame.

2. The system according to claim 1, wherein said adapter cards are CompactPCI adapter cards.

3. The system according to claim 2, wherein said CompactPCI adapter cards are one of a type 3U and 6U form factor CompactPCI cards.

4. The system according to claim 2, wherein said CompactPCI adapter cards are a combination of types 3U and 6U form factor CompactPCI cards.

5. A system for housing one or more adapter cards of a given depth in a frame comprising a frame backplane wherein the depth of said frame backplane is larger than the depth of said adapter card, the system comprising:

an intermediate backplane for connecting on a front side of said intermediate backplane said adapter cards; and a system card connected to said frame backplane and to a back side (102) of said intermediate backplane;

wherein the depth of said system card plus the depth of said adapter cards spans the depth of the frame, and wherein said intermediate backplane further comprises: one or more connectors mounted on said front side of said intermediate backplane for connecting said adapter cards, and one double-headed connector having a first head mounted on said front side of said intermediate backplane and a second head mounted on said back side of said intermediate backplane, for connecting an adapter card to said first head and said system card to said second head.

6. The system according to claim 5, wherein said connectors mounted on the front of said intermediate backplane and said double-headed connector are CompactPCI connectors.

* * * * *